United States Patent
Goel et al.

(10) Patent No.: US 11,782,810 B2
(45) Date of Patent: Oct. 10, 2023

(54) SYSTEMS AND METHODS FOR AUTOMATED FIELD REPLACEMENT COMPONENT CONFIGURATION

(71) Applicant: Dell Products, L.P., Round Rock, TX (US)

(72) Inventors: Naman Goel, Bangalore (IN); Ravikanth Chaganti, Bangalore (IN); Ravishankar Kanakapura N, Bangalore (IN); Harsha Naik, Bangalore (IN)

(73) Assignee: Dell Products, L.P., Round Rock, TX (US)

( * ) Notice: Subject to any disclaimer, the term of this patent is extended or adjusted under 35 U.S.C. 154(b) by 585 days.

(21) Appl. No.: 16/692,683

(22) Filed: Nov. 22, 2019

(65) Prior Publication Data
US 2021/0157701 A1 May 27, 2021

(51) Int. Cl.
*G06F 11/30* (2006.01)
*H05K 7/14* (2006.01)

(52) U.S. Cl.
CPC ...... *G06F 11/3044* (2013.01); *G06F 11/3051* (2013.01); *H05K 7/1487* (2013.01); *H05K 7/1489* (2013.01)

(58) Field of Classification Search
CPC ............. G06F 11/3044; G06F 11/3051; H05K 7/1487; H05K 7/1489; H05K 7/1498
See application file for complete search history.

(56) References Cited

U.S. PATENT DOCUMENTS

| | | | |
|---|---|---|---|
| 10,888,016 B2 * | 1/2021 | Jensen | G06F 9/5088 |
| 10,990,309 B2 * | 4/2021 | Bernat | H05K 7/1487 |
| 2006/0037000 A1 * | 2/2006 | Speeter | G06F 8/71 |
| | | | 717/120 |
| 2011/0289327 A1 * | 11/2011 | Nolterieke | G06F 1/3287 |
| | | | 713/300 |
| 2013/0318225 A1 * | 11/2013 | McCloy | H05K 7/1487 |
| | | | 709/223 |
| 2014/0173065 A1 | 6/2014 | Sears | |
| 2015/0046761 A1 * | 2/2015 | Messer | G06F 11/00 |
| | | | 714/710 |
| 2015/0058542 A1 * | 2/2015 | Chao | G06F 11/1451 |
| | | | 711/103 |

(Continued)

*Primary Examiner* — Matthew J Brophy
(74) *Attorney, Agent, or Firm* — Fogarty LLP

(57) ABSTRACT

Method and systems provide automated configuration of replaceable hardware components of a chassis comprising a plurality of IHSs (Information Handling Systems) and a plurality of storage devices that are configured to support demands of a specific computing solution designed for a particular computing task. The IHSs may be computing sleds and the storage devices may be storage sleds, where the sleds are coupled within bays of the chassis. Processes operating on the IHSs monitor for changes to settings related to the first computing solution. A chassis management controller detects updates to the replaceable hardware components that are coupled to the chassis and determines supported settings for detected new hardware components. Parameters for configuring the new hardware components for supporting the first computing solution are selected and used to configure the new hardware components.

20 Claims, 3 Drawing Sheets

(56) References Cited

U.S. PATENT DOCUMENTS

| | | | | |
|---|---|---|---|---|
| 2018/0025299 A1* | 1/2018 | Kumar | ................ | G06F 13/4022 |
| | | | | 709/224 |
| 2018/0027681 A1* | 1/2018 | Davis | ................... | H05K 7/1498 |
| | | | | 361/679.31 |
| 2018/0150343 A1* | 5/2018 | Bernat | ................ | G06F 13/4022 |
| 2019/0004910 A1* | 1/2019 | Guim Bernat | .......... | G06F 21/44 |
| 2019/0042126 A1* | 2/2019 | Sen | ......................... | G06F 3/065 |
| 2019/0062053 A1* | 2/2019 | Jensen | ................ | G06F 11/3466 |
| 2019/0065172 A1* | 2/2019 | Nachimuthu | ....... | H04L 41/5025 |
| 2020/0050497 A1* | 2/2020 | Kumar | ................. | H05K 7/1491 |
| 2020/0348966 A1* | 11/2020 | Padala | .................. | G06F 9/4856 |
| 2021/0144517 A1* | 5/2021 | Guim Bernat | ........ | H04W 12/04 |
| 2021/0157701 A1* | 5/2021 | Goel | ................... | H05K 7/1487 |

* cited by examiner

SYSTEMS AND METHODS FOR AUTOMATED FIELD REPLACEMENT COMPONENT CONFIGURATION

FIELD

The present disclosure generally relates to Information Handling Systems (IHSs), and, more particularly, to the configuration of IHSs.

BACKGROUND

As the value and use of information continues to increase, individuals and businesses seek additional ways to process and store information. One option available to users is Information Handling Systems (IHSs). An IHS generally processes, compiles, stores, and/or communicates information or data for business, personal, or other purposes thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

Groups of IHSs may be housed within data center environments. A data center may include a large number of IHSs, such as enterprise blade servers that are stacked and installed within racks. A data center may include large numbers of such server racks that are organized into rows of racks. Administration of such large groups of IHSs may require teams of remote and local administrators working in shifts in order to support availability of the data center operations while minimizing downtime. In some instances, servers may be initially configured with hardware and software resources that are suited to particular computing tasks. However, due to maintenance, upgrades and repairs of malfunctioning components, the configuration of servers may be modified over time such that the specialized capabilities of a server may be compromised. In addition, due to the complexity of data center administration, manual configuration of updated and new components may result in misconfigured or suboptimally configured components, further compromising the specialized server capabilities.

SUMMARY

In various embodiments, methods provide automated configuration of replaceable hardware components of a chassis comprising a plurality of IHSs (Information Handling Systems) configured to support a first computing solution. The methods include: initializing, by each of the plurality of IHSs, a process for monitoring changes to settings related to the first computing solution; detecting, by a chassis management controller, updates to the replaceable hardware components of the chassis; determining supported settings for a new hardware component coupled to the chassis via the detected updates; selecting, based on the supported settings, parameters for configuring the new hardware component to support the first computing solution; and configuring the new hardware component according to the selected parameters for supporting the first computing solution.

In additional method embodiments, the new hardware component is an additional IHS coupled to the chassis. In additional method embodiments, the additional IHS is a computing sled coupled to a bay of the chassis. In additional embodiments, methods further include generating, by the chassis management controller, a script for configuring the new hardware component according to the selected parameters. In additional method embodiments, the new hardware component is a storage device coupled to the IHS. In additional method embodiments, the storage device is a storage sled coupled to a bay of the chassis. In additional method embodiments, the supported settings for the new hardware component are determined by the chassis management controller based on a settings repository maintained by the chassis management controller. In additional embodiments, methods further include selecting, based on the supported settings, parameters for configuring the new hardware component to support a second computing solution. In additional embodiments, methods further include determining, by the chassis management controller, the new hardware component supports the first computing solution based on a solution blueprint. In additional method embodiments, the solution blueprint specifies hardware components that support the first computing solution.

In additional embodiments, a chassis management controller is configured as a component of a chassis comprising a plurality of IHSs (Information Handling Systems) configured to support a first computing solution. The chassis management controller includes: one or more processors; and a memory device coupled to the one or more processors, the memory device storing computer-readable instructions that, upon execution by the one or more processors, cause the chassis management controller to: receive, from each of the plurality of IHSs, changes to settings of each respective IHS related to the first computing solution; detect updates to replaceable hardware components of the chassis; determine supported settings for a new hardware component coupled to the chassis via the detected updates; select, based on the supported settings, parameters for configuring the new hardware component to support the first computing solution; and generate instructions for configuring the new hardware component according to the selected parameters for supporting the first computing solution.

In additional chassis management controller embodiments, the new hardware component is an additional IHS coupled to the chassis. In additional chassis management controller embodiments, the new hardware component is a storage device coupled to the IHS. In additional chassis management controller embodiments, the supported settings for the new hardware component are determined based on a settings repository maintained by the chassis management controller. In additional chassis management controller embodiments, execution of the instructions further causes the chassis management controller to determine the new hardware component supports the first computing solution based on a solution blueprint.

In additional embodiments, a memory device is coupled to one or more processors, the memory device storing computer-readable instructions that, upon execution by the one or more processors, cause the processors to: receive, from each of a plurality of IHSs coupled to a chassis and configured to support a first computing solution, changes to settings of each respective IHS related to the first computing solution; detect updates to replaceable hardware components of the chassis; determine supported settings for a new hardware component coupled to the chassis via the detected updates; select, based on the supported settings, parameters for configuring the new hardware component to support the first computing solution; and generate instructions for configuring the new hardware component according to the selected parameters for supporting the first computing solution.

In additional memory device embodiments, the new hardware component is an additional IHS coupled to the chassis. In additional memory device embodiments, the new hardware component is a storage device coupled to the IHS. In additional memory device embodiments, the supported settings for the new hardware component are determined based on a settings repository maintained by the chassis management controller. In additional memory device embodiments, execution of the instructions further causes the chassis management controller to determine the new hardware component supports the first computing solution based on a solution blueprint.

BRIEF DESCRIPTION OF THE DRAWINGS

The present invention(s) is/are illustrated by way of example and is/are not limited by the accompanying figures. Elements in the figures are illustrated for simplicity and clarity, and have not necessarily been drawn to scale.

DETAILED DESCRIPTION

Figure 1:
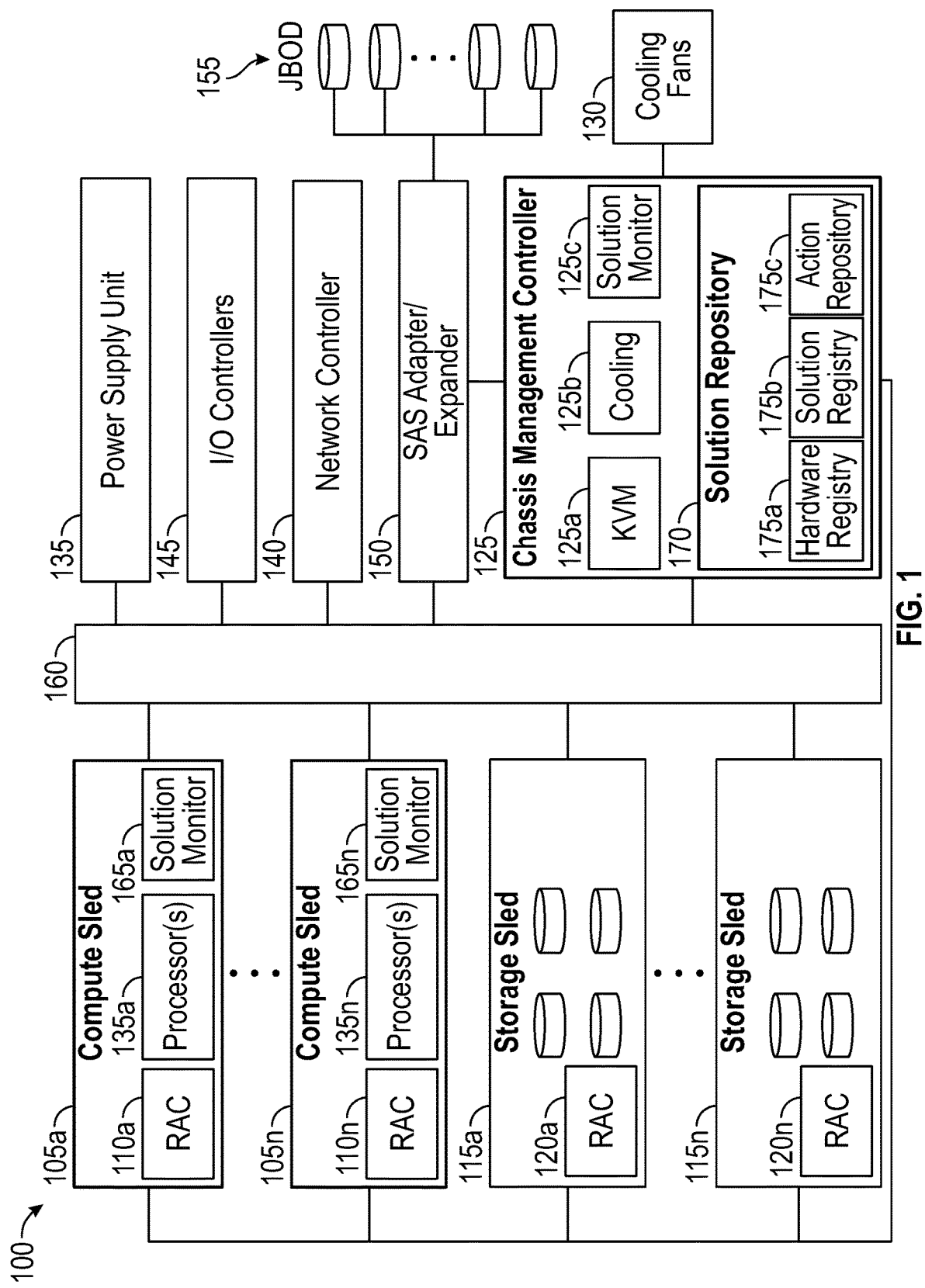
FIG. 1 is a block diagram illustrating certain components of a chassis, according to some embodiments, for automated configuration of replaceable hardware components of the chassis.

FIG. 1 is a block diagram illustrating certain components of a chassis 100 comprising one or more compute sleds 105a-n and one or more storage sleds 115a-n that may be configured to implement the systems and methods described herein. Chassis 100 may include one or more bays that each receive an individual sled (that may be additionally or alternatively referred to as a tray, blade, and/or node), such as compute sleds 105a-n and storage sleds 115a-n. Chassis 100 may support a variety of different numbers (e.g., 4, 8, 16, 32), sizes (e.g., single-width, double-width) and physical configurations of bays. Other embodiments may include additional types of sleds that provide various types of storage and/or processing capabilities. Other types of sleds may provide power management and networking functions. Sleds may be individually installed and removed from the chassis 100, thus allowing the computing and storage capabilities of a chassis to be reconfigured by swapping the sleds with different types of sleds, in many cases without affecting the operations of the other sleds installed in the chassis 100.

By configuring a chassis 100 with different sleds, the chassis may be adapted to support specific types of operations, thus providing a computing solution directed towards a specific type of computational task. For instance, a chassis 100 that is configured to support artificial intelligence computing solutions may include additional compute sleds, compute sleds that include additional processors, and/or compute sleds that include specialized artificial intelligence processors or other specialized artificial intelligence components, such as specialized FPGAs. In another example, a chassis 100 configured to support specific data mining operations may include network controllers 140 that support high-speed couplings with other similarly configured chassis, thus supporting high-throughput, parallel-processing computing solutions. In another example, a chassis 100 configured to support certain database operations may be configured with specific types of storage sleds 115a-n that provide increased storage space or that utilize adaptations that support optimized performance for specific types of databases. In other scenarios, a chassis 100 may be configured to support specific enterprise applications, such as by utilizing compute sleds 105a-n and storage sleds 115a-n that include additional memory resources that support simultaneous use of enterprise applications by multiple remote users. In another example, a chassis 100 may include compute sleds 105a-n and storage sleds 115a-n that support secure and isolated execution spaces for specific types of virtualized environments.

Multiple chassis 100 may be housed within a rack. Data centers may utilize large numbers of racks, with various different types of chassis installed in the various configurations of racks. The modular architecture provided by the sleds, chassis and rack allow for certain resources, such as cooling, power and network bandwidth, to be shared by the compute sleds 105a-n and the storage sleds 115a-n, thus providing efficiency improvements and supporting greater computational loads.

Chassis 100 may be installed within a rack structure that provides all or part of the cooling utilized by chassis 100. For airflow cooling, a rack may include one or more banks of cooling fans that may be operated to ventilate heated air from within the chassis 100 that is housed within the rack. The chassis 100 may alternatively or additionally include one or more cooling fans 130 that may be similarly operated to ventilate heated air from within the sleds 105a-n, 115a-n installed within the chassis. A rack and a chassis 100 installed within the rack may utilize various configurations and combinations of cooling fans to cool the sleds 105a-n, 115a-n and other components housed within chassis 100.

The sleds 105a-n, 115a-n may be individually coupled to chassis 100 via connectors that correspond to the bays provided by the chassis 100 and that physically and electrically couple an individual sled to a backplane 160. Chassis backplane 160 may be a printed circuit board that includes electrical traces and connectors that are configured to route signals between the various components of chassis 100 that are connected to the backplane 160. In various embodiments, backplane 160 may include various additional components, such as cables, wires, midplanes, backplanes, connectors, expansion slots, and multiplexers. In certain embodiments, backplane 160 may be a motherboard that includes various electronic components installed thereon. In some embodiments, components installed on a motherboard backplane 160 may include components that implement all or part of the functions described with regard to components such as the SAS (Serial Attached SCSI) expander 150, I/O controllers 145, network controller 140 and power supply unit 135.

Figure 2:
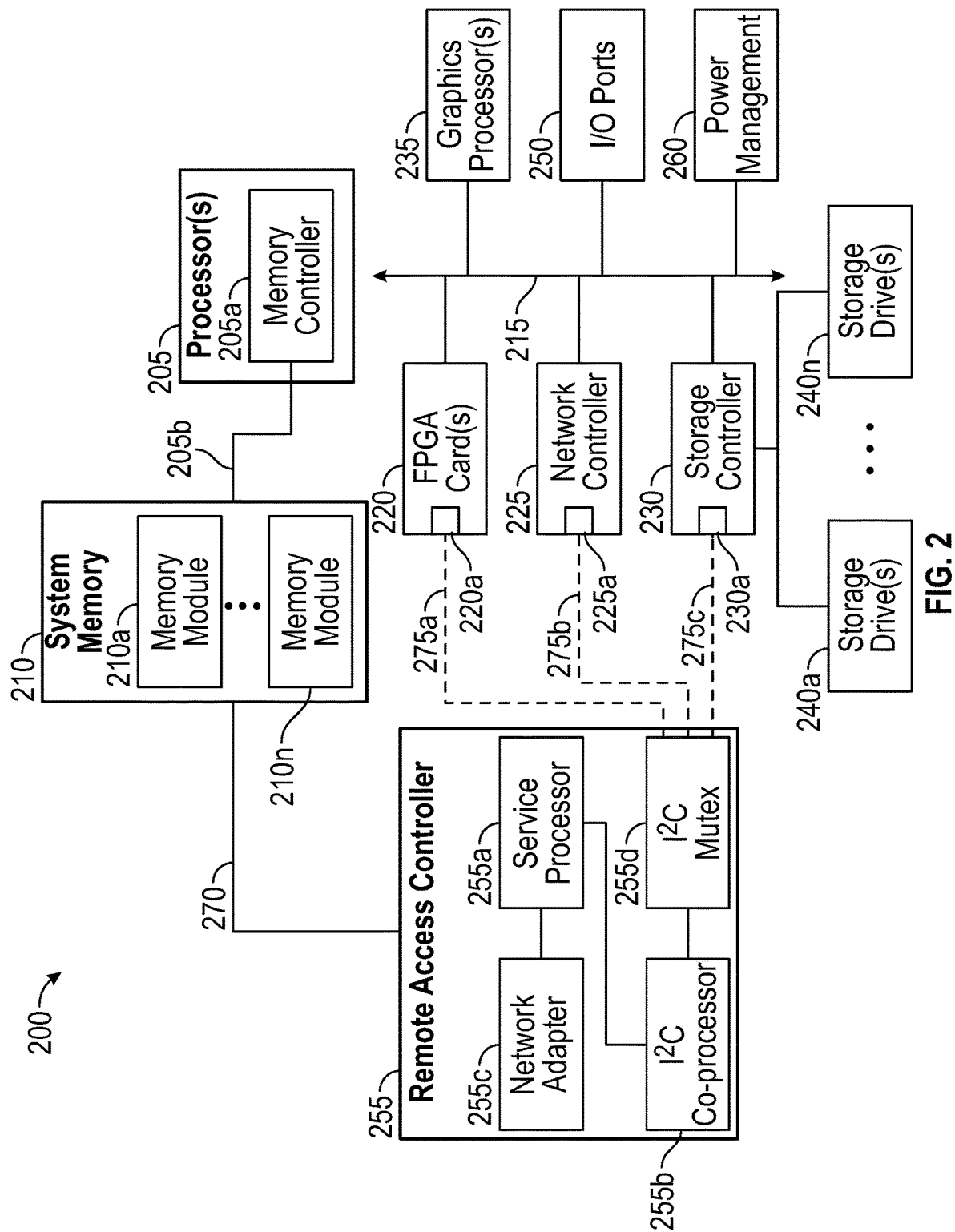
FIG. 2 is a block diagram illustrating certain components of an IHS configured as a component of a chassis, according to some embodiments, for automated configuration of replaceable hardware components of the chassis.

In certain embodiments, a compute sled 105a-n may be an IHS such as described with regard to IHS 200 of FIG. 2. A compute sled 105a-n may provide computational processing resources that may be used to support a variety of e-commerce, multimedia, business and scientific computing applications, in some cases as services provided via a cloud implementation. Compute sleds 105a-n are typically configured with hardware and software that provide leading-edge computational capabilities. Accordingly, services provided using such computing capabilities are typically provided as high-availability systems that operate with minimum downtime. As described in additional detail with regard to FIG. 2, compute sleds 105a-n may be configured for general-purpose computing or may be optimized for specific computing tasks in support of specific computing solutions.

As illustrated, each compute sled 105a-n includes a remote access controller (RAC) 110a-n. As described in additional detail with regard to FIG. 2, a remote access controller 110a-n provides capabilities for remote monitoring and management of compute sled 105a-n. In support of these monitoring and management functions, remote access controllers 110a-n may utilize both in-band and sideband (i.e., out-of-band) communications with various internal components of a compute sled 105a-n and with other components of chassis 100. Remote access controller 110a-n may collect sensor data, such as temperature sensor readings, from components of the chassis 100 in support of airflow cooling of the chassis 100 and the sleds 105a-n, 115a-n. In some embodiments, remote access controllers 110a-n may support communications with chassis management controller 125 by reporting configuration information for use in automatically configuring replacement components of the chassis 100 in order to support a particular computing solution.

A compute sled 105a-n may include one or more processors 135a-n that support specialized computing operations, such as high-speed computing, artificial intelligence processing, database operations, parallel processing, graphics operations, streaming multimedia and/or isolated execution spaces for virtualized environments. Using such specialized processor capabilities of a compute sled 105a-n, a chassis 100 may be adapted for a particular computing solution. As indicated in FIG. 1, a compute sled 105a-n may also include a solution monitor 165a-n. As described in additional detail with regard to FIG. 3, an individual solution monitor 165a may monitor the hardware and/or software capabilities of a compute sled 105a that are related to computing solutions that may be supported by the chassis 100. In addition, a solution monitor 165a may report any detected changes to the hardware and/or software capabilities of a compute sled 105a that are related to a supported computing solution. The settings and changes detected by the solution monitors 165a-n may be reported to the chassis management controller 125 for use in automated configuration of replaceable chassis components for supporting computing solutions.

In some embodiments, each compute sled 105a-n may include a storage controller that may be utilized to access storage drives that are accessible via chassis 100. Some of the individual storage controllers may provide support for RAID (Redundant Array of Independent Disks) configurations of logical and physical storage drives, such as storage drives provided by storage sleds 115a-n. In some embodiments, some or all of the individual storage controllers utilized by compute sleds 105a-n may be HBAs (Host Bus Adapters) that provide more limited capabilities in accessing physical storage drives provided via storage sleds 115a-n and/or via SAS expander 150.

As illustrated, chassis 100 also includes one or more storage sleds 115a-n that are coupled to the backplane 160 and installed within one or more bays of chassis 200 in a similar manner to compute sleds 105a-n. Each of the individual storage sleds 115a-n may include various different numbers and types of storage devices. For instance, storage sleds 115a-n may include SAS (Serial Attached SCSI) magnetic disk drives, SATA (Serial Advanced Technology Attachment) magnetic disk drives, solid-state drives (SSDs) and other types of storage drives in various combinations. The storage sleds 115a-n may be utilized in various storage configurations by the compute sleds 105a-n that are coupled to chassis 100. As illustrated, each storage sled 115a-n may include a remote access controller (RAC) 120a-n. Remote access controllers 120a-n may provide capabilities for remote monitoring and management of storage sleds 115a-n in a similar manner to the remote access controllers 110a-n included in compute sleds 105a-n.

In addition to the data storage capabilities provided by storage sleds 115a-n, chassis 100 may provide access to other storage resources that may be installed components of chassis 100 and/or may be installed elsewhere within a rack housing the chassis 100, such as within a storage blade. In certain scenarios, such storage resources 155 may be accessed via a SAS expander 150 that is coupled to the backplane 160 of the chassis 100. The SAS expander 150 may support connections to a number of JBOD (Just a Bunch Of Disks) storage drives 155 that may be configured and managed individually and without implementing data redundancy across the various drives 155. The additional storage resources 155 may also be at various other locations within a datacenter in which chassis 100 is installed. Such additional storage resources 155 may also be remotely located from chassis 100.

As illustrated, the chassis 100 of FIG. 1 includes a network controller 140 that provides network access to the sleds 105a-n, 115a-n installed within the chassis. Network controller 140 may include various switches, adapters, controllers and couplings used to connect chassis 100 to a network, either directly or via additional networking components and connections provided via a rack in which chassis 100 is installed. In some embodiments, network controllers 140 may be replaceable components that include capabilities that support certain computing solutions, such as network controllers 140 that interface directly with network controllers from other chassis in support of clustered processing capabilities that utilize resources from multiple chassis.

Chassis 100 may also include a power supply unit 135 that provides the components of the chassis with various levels of DC power from an AC power source or from power delivered via a power system provided by a rack within which chassis 100 may be installed. In certain embodiments, power supply unit 135 may be implemented within a sled that may provide chassis 100 with redundant, hot-swappable power supply units. In such embodiments, power supply unit 135 is a replaceable component that may be used in support of certain computing solutions.

Chassis 100 may also include various I/O controllers 140 that may support various I/O ports, such as USB ports that may be used to support keyboard and mouse inputs and/or video display capabilities. Such I/O controllers 145 may be utilized by a chassis management controller 125 to support various KVM (Keyboard, Video and Mouse) 125a capabilities that provide administrators with the ability to interface with the chassis 100.

In addition to providing support for KVM 125a capabilities for administering chassis 100, chassis management controller 125 may support various additional functions for sharing the infrastructure resources of chassis 100. In some scenarios, chassis management controller 125 may implement tools for managing the power 135, network bandwidth 140 and airflow cooling 130 that are available via the chassis 100. As described, the airflow cooling 130 utilized by chassis 100 may include an airflow cooling system that is provided by a rack in which the chassis 100 may be installed and managed by a cooling module 125*b* of the chassis management controller 125.

As described, components of chassis 100 such as compute sleds 105*a-n* may include solution monitoring 165*a-n* capabilities that report configurations and changes related to computing solutions. Chassis management controller 125 may similarly include a solution monitor 125*c* that tracks computing solution configuration settings for some chassis components. As described, power supply unit 135 and network controller 140 may be replaceable components that may be configured in support of computing solutions. The solution monitor 125*c* of the chassis management controller 125 may query such components for settings related to computing solutions and may detect any changes to these replaceable components that may affect support for computing solutions.

As illustrated, the chassis management controller 125 may include a solution repository 170 that stores computing solution configuration information for components of the chassis 100. For instance, chassis management controller 125 may record configuration information received from solution monitors 165*a-n*, 125*c* of the chassis 100 in the solution repository 170. In some embodiments, the solution repository 170 may include a hardware register 175*a* used for tracking the replaceable hardware components currently installed within chassis 100, as well as valid hardware settings for these replaceable components, such as supported firmware versions, BIOS settings and boot settings for each of the replaceable components. As replaceable hardware components are identified and their settings are collected, the chassis management controller augments the hardware registry to include these settings as valid hardware configurations for each type of replaceable component. As described with regard to FIG. 4, computing solution configurations may also be received by the chassis management controller 125 from an administrative source, where the received configurations specify valid computing solution configurations (i.e., computing solution blueprints) that identify hardware components and component configurations that may comprise a computing solution.

Received blueprints may include a preferred configuration for a computing solution as well as alternative configurations supported by a computing solution. For instance, a blueprint may specify a preferred components for use in implementing a particular computing solution, such as a preference for use of a compute sled that includes a specialized artificial intelligence processor, as well as alternative components, such as compute sleds that include processors that operate as speeds above a specified threshold and include specific types and amounts of memory. In another example, a blueprint may specify a preferred network controller 140 model, but may also specify other alternate models that may instead be used in valid computing solution configurations.

In some embodiments, the solution repository 170 may also include a solution registry 175*b* used for recording settings for configuring the replaceable hardware components of chassis 100 in support of one or more computing solutions. For instance, the solution registry 175*b* may include settings for configuring specific enterprise applications, such as databases or other business software, supported by a computing solution. The solution registry 175*b* may also include settings for configuring virtual interfaces that are formed from logically combining multiple replaceable components, such as logical combinations of storage sleds 115*a-n* that present a single storage interface or logical combinations of network controllers 140 that present a single network interface. The solution registry 175*b* may also include settings for configuring the operating systems of compute nodes 105*a-n* for participation in a computing solution, such as installing artificial intelligence, e-commerce, database or other computing packages for use in support of a computing solution. Such operating system configurations included in the solution registry 175*b* may include settings for utilizing virtual interfaces formed from logical combinations of replaceable hardware components of the chassis.

In certain embodiments, the solution repository 170 may also include an action repository 175*c* that may be used to generate scripts and commands used to configure replaceable hardware components with the configuration information available in the hardware registry 175*a* and the solution registry 175*b*. As described in additional detail with regard to FIG. 3, the action repository 175*c* may generate scripts that include settings for configuring a replaceable hardware component, as well as validating the replaceable hardware component as being suitable for use in support of a computing solution and testing a configured component in order to ensure it is properly configured for use by a computing solution.

For purposes of this disclosure, an IHS may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An IHS may include Random Access Memory (RAM), one or more processing resources such as a Central Processing Unit (CPU) or hardware or software control logic, Read-Only Memory (ROM), and/or other types of nonvolatile memory. Additional components of an IHS may include one or more disk drives, one or more network ports for communicating with external devices as well as various I/O devices, such as a keyboard, a mouse, touchscreen, and/or a video display. As described, an IHS may also include one or more buses operable to transmit communications between the various hardware components. An example of an IHS is described in more detail below.

FIG. 2 shows an example of an IHS 200 configured to implement systems and methods described herein. It should be appreciated that although the embodiments described herein may describe an IHS that is a compute sled or similar computing component that may be deployed within the bays of a chassis, other embodiments may be utilized with other types of IHSs. In the illustrative embodiment of FIG. 2, IHS 200 may be a computing component, such as compute sled 105*a-n*, that is configured to share infrastructure resources provided by a chassis 100 in support of specific computing solutions.

The IHS 200 of FIG. 2 may be a compute sled, such as compute sleds 105*a-n* of FIG. 1, that may be installed within a chassis, that may in turn be installed within a rack. Accordingly, IHS 200 may be comprised within a large system of similarly configured IHSs that may be housed within the same chassis, rack and/or datacenter. IHS 200 may utilize one or more processors 205. In some embodiments, processors 205 may include a main processor and a co-processor, each of which may include a plurality of processing cores that, in certain scenarios, may each be used to run an instance of a server process. In certain embodiments, one, some or all processor(s) 205 may be graphics processing units (GPUs). In some embodiments, one, some or all processor(s) 205 may be specialized processors, such as artificial intelligence processors or processor adapted to support high-throughput parallel processing computations. As described, such specialized adaptations of IHS 200 may be used to implement specific computing solutions support by the chassis in which IHS 200 is installed.

As illustrated, processor(s) 205 includes an integrated memory controller 205a that may be implemented directly within the circuitry of the processor 205, or the memory controller 205a may be a separate integrated circuit that is located on the same die as the processor 205. The memory controller 205a may be configured to manage the transfer of data to and from the system memory 210 of the IHS 205 via a high-speed memory interface 205b.

The system memory 210 is coupled to processor(s) 205 via a memory bus 205b that provides the processor(s) 205 with high-speed memory used in the execution of computer program instructions by the processor(s) 205. Accordingly, system memory 210 may include memory components, such as such as static RAM (SRAM), dynamic RAM (DRAM), NAND Flash memory, suitable for supporting high-speed memory operations by the processor(s) 205. In certain embodiments, system memory 210 may combine both persistent, non-volatile memory and volatile memory.

In certain embodiments, the system memory 210 may be comprised of multiple removable memory modules. The system memory 210 of the illustrated embodiment includes removable memory modules 210a-n. Each of the removable memory modules 210a-n may correspond to a printed circuit board memory socket that receives a removable memory module 210a-n, such as a DIMM (Dual In-line Memory Module), that can be coupled to the socket and then decoupled from the socket as needed, such as to upgrade memory capabilities or to replace faulty components. Other embodiments of IHS system memory 210 may be configured with memory socket interfaces that correspond to different types of removable memory module form factors, such as a Dual In-line Package (DIP) memory, a Single In-line Pin Package (SIPP) memory, a Single In-line Memory Module (SIMM), and/or a Ball Grid Array (BGA) memory.

IHS 200 may utilize a chipset that may be implemented by integrated circuits that are connected to each processor 205. All or portions of the chipset may be implemented directly within the integrated circuitry of an individual processor 205. The chipset may provide the processor(s) 205 with access to a variety of resources accessible via one or more buses 215. Various embodiments may utilize any number of buses to provide the illustrated pathways served by bus 215. In certain embodiments, bus 215 may include a PCIe (PCI Express) switch fabric that is accessed via a PCIe root complex. IHS 200 may also include one or more I/O ports 250, such as PCIe ports, that may be used to couple the IHS 200 directly to other IHSs, storage resources or other peripheral components. In certain embodiments, the I/O ports 250 may provide couplings to the backplane of the chassis in which the IHS 200 is installed.

As illustrated, a variety of resources may be coupled to the processor(s) 205 of the IHS 200 via bus 215. For instance, processor(s) 205 may be coupled to a network controller 225, such as provided by a Network Interface Controller (NIC) that is coupled to the IHS 200 and allows the IHS 200 to communicate via an external network, such as the Internet or a LAN. Processor(s) 205 may also be coupled to a power management unit 260 that may interface with the power system unit 135 of the chassis 100 in which an IHS 200, such as a compute sled, may be installed. In certain embodiments, a graphics processor 235 may be comprised within one or more video or graphics cards, or an embedded controller, installed as components of the IHS 200. In certain embodiments, graphics processor 235 may be an integrated of the remote access controller 255 and may be utilized to support the display of diagnostic and administrative interfaces related to IHS 200 via display devices that are coupled, either directly or remotely, to remote access controller 255.

As illustrated, IHS 200 may include one or more FPGA (Field-Programmable Gate Array) card(s) 220. Each of the FPGA card 220 supported by IHS 200 may include various processing and memory resources, in addition to an FPGA integrated circuit that may be reconfigured after deployment of IHS 200 through programming functions supported by the FPGA card 220. Each individual FGPA card 220 may be optimized to perform specific processing tasks, such as specific signal processing, security, data mining, and artificial intelligence functions, and/or to support specific hardware coupled to IHS 200. In certain embodiments, such specialized functions supported by an FPGA card 220 may be utilized by IHS 200 in support of certain computing solutions. In such embodiments, the instructions used to program FPGA 220 may be reported to the chassis management controller along with other settings of IHS 200 that are used to implement supported computing solutions.

IHS 200 may also support one or more storage controllers 230 that may be utilized to provide access to virtual storage configurations. For instance, storage controller 230 may provide support for RAID (Redundant Array of Independent Disks) configurations of storage devices 240a-n, such as storage drives provided by storage sleds 115a-n and/or JBOD 155 of FIG. 1. In some embodiments, storage controller 230 may be an HBA (Host Bus Adapter).

In certain embodiments, IHS 200 may operate using a BIOS (Basic Input/Output System) that may be stored in a non-volatile memory accessible by the processor(s) 205. The BIOS may provide an abstraction layer by which the operating system of the IHS 200 interfaces with the hardware components of the IHS. Upon powering or restarting IHS 200, processor(s) 205 may utilize BIOS instructions to initialize and test hardware components coupled to the IHS, including both components permanently installed as components of the motherboard of IHS 200 and removable components installed within various expansion slots supported by the IHS 200. The BIOS instructions may also load an operating system for use by the IHS 200. In some embodiments, BIOS instructions may be reported to the chassis management controller along with other settings of IHS 200 that are used to implement supported computing solutions. In certain embodiments, IHS 200 may utilize Unified Extensible Firmware Interface (UEFI) in addition to or instead of a BIOS. In certain embodiments, the functions provided by a BIOS may be implemented, in full or in part, by the remote access controller 255.

In certain embodiments, remote access controller 255 may operate from a different power plane from the processors 205 and other components of IHS 200, thus allowing the remote access controller 255 to operate, and management tasks to proceed, while the processing cores of IHS 200 are powered off. As described, various functions provided by the BIOS, including launching the operating system of the IHS 200, may be implemented by the remote access controller 255. In some embodiments, the remote access controller 255 may perform various functions to verify the integrity of the IHS 200 and its hardware components prior to initialization of the IHS 200 (i.e., in a bare-metal state).

Remote access controller 255 may include a service processor 255a, or specialized microcontroller, that operates management software that supports remote monitoring and administration of IHS 200. Remote access controller 255 may be installed on the motherboard of IHS 200 or may be coupled to IHS 200 via an expansion slot provided by the motherboard. In support of remote monitoring functions, network adapter 225c may support connections with remote access controller 255 using wired and/or wireless network connections via a variety of network technologies. As a non-limiting example of a remote access controller, the integrated Dell Remote Access Controller (iDRAC) from Dell® is embedded within Dell PowerEdge™ servers and provides functionality that helps information technology (IT) administrators deploy, update, monitor, and maintain servers remotely. In some embodiments, instructions used to configure remote access controller 255 may be reported to the chassis management controller along with other settings of IHS 200 that are used to implement supported computing solutions.

In some embodiments, remote access controller 255 may support monitoring and administration of various devices 220, 225, 230 of an IHS via a sideband interface. In such embodiments, the messages in support of the monitoring and management function may be implemented using MCTP (Management Component Transport Protocol) that may be transmitted using I2C sideband bus connection 275a-c established with each of the respective managed devices 220, 225, 230. As illustrated, the managed hardware components of the IHS 200, such as FPGA cards 220, network controller 225 and storage controller 230, are coupled to the IHS processor(s) 205 via an in-line bus 215, such as a PCIe root complex, that is separate from the I2C sideband bus connection 275a-c.

In certain embodiments, the service processor 255a of remote access controller 255 may rely on an I2C co-processor 255b to implement sideband I2C communications between the remote access controller 255 and managed components 220, 225, 230 of the IHS. The I2C co-processor 255b may be a specialized co-processor or micro-controller that is configured to interface via a sideband I2C bus interface with the managed hardware components 220, 225, 230 of IHS. In some embodiments, the I2C co-processor 255b may be an integrated component of the service processor 255a, such as a peripheral system-on-chip feature that may be provided by the service processor 255a. Each I2C bus 275a-c is illustrated as single line in FIG. 2. However, each I2C bus 275a-c may be comprised of a clock line and data line that couple the remote access controller 255 to I2C endpoints 220a, 225a, 230a.

As illustrated, the I2C co-processor 255b may interface with the individual managed devices 220, 225 and 230 via individual sideband I2C buses 275a-c selected through the operation of an I2C multiplexer 255d. Via switching operations by the I2C multiplexer 255d, a sideband bus connection 275a-c may be established by a direct coupling between the I2C co-processor 255b and an individual managed device 220, 225 or 230.

In providing sideband management capabilities, the I2C co-processor 255b may each interoperate with corresponding endpoint I2C controllers 220a, 225a, 230a that implement the I2C communications of the respective managed devices 220, 225, 230. The endpoint I2C controllers 220a, 225a, 230a may be implemented as a dedicated microcontroller for communicating sideband I2C messages with the remote access controller 255, or endpoint I2C controllers 220a, 225a, 230a may be integrated SoC functions of a processor of the respective managed device endpoints 220, 225, 230.

As described, a compute node such as IHS 200 may include a solution monitor that collects and monitors settings of the IHS 200 that relate to supported computing solutions. In some embodiments, a solution monitor may be implemented as a process of remote access controller 255, where the solution configuration information from IHS 200 components 220, 225, 230 may be collected by service processor 255a via the out-of-band management connections 275a-c supported by I2C co-processor 255b. The collected configuration information may then be reported to the chassis management controller via a connection supported by the network adapter 255c of the remote access controller 255. In embodiments where IHS 200 is a compute sled, upon being coupled to a chassis, remote access controller 255 may receive configuration scripts from a chassis management controller for use in configuring IHS 200 in support of a particular computing solution.

In various embodiments, an IHS 200 does not include each of the components shown in FIG. 2. In various embodiments, an IHS 200 may include various additional components in addition to those that are shown in FIG. 2. Furthermore, some components that are represented as separate components in FIG. 2 may in certain embodiments instead be integrated with other components. For example, in certain embodiments, all or a portion of the functionality provided by the illustrated components may instead be provided by components integrated into the one or more processor(s) 205 as a systems-on-a-chip.

Figure 3:
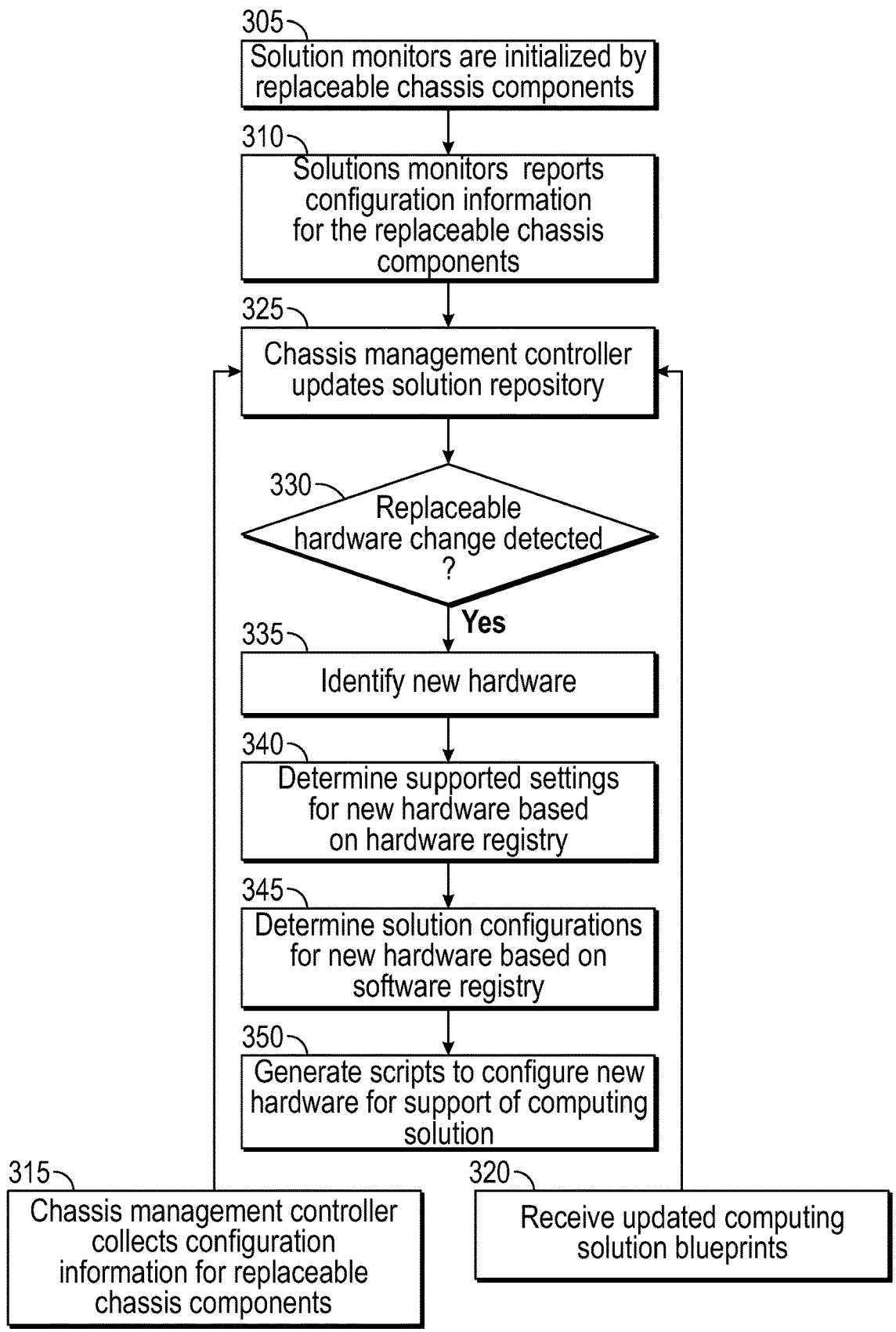
FIG. 3 is a flowchart diagram illustrating certain steps of a process, according to some embodiments, for automated configuration of replaceable hardware components of a chassis.

FIG. 3 is a flowchart diagram illustrating certain steps of a process, according to some embodiments, for automated configuration of replaceable hardware components of a chassis, such as chassis 100 and the replaceable hardware components of chassis 100 described with regard to FIG. 1. The illustrated embodiment begins at 305 with the initialization of one or more solution monitor processes. As described, a chassis may include one or more compute sleds that may each utilize a separately instantiated operating system. In some embodiments, the operating system of each compute sled may include a solution monitoring process. In some embodiments, the solution monitor process may instead be implemented external to the operating system of a compute sled and may be a process instantiated by a remote access controller of a compute sled. As described with regard to FIG. 1, a chassis management controller may also include a solution monitor process that collects configuration information for certain replaceable chassis components.

At block 310, the solution monitors collect the hardware or software capabilities of the chassis that are related to computing solutions that are supported by the chassis. As described, a compute sled may provide support for specific computing solutions through capabilities that may include specialized processors, specific memory resources, specific networking capabilities and/or adaptations for specific enterprise applications. As described with regard to FIG. 2, a compute sled or other IHS component of a chassis may include an FPGA that may be programmed to provide support for specialized computing tasks, such as artificial intelligence and/or secure task execution. The solution monitors may collectively identify all such hardware and software capabilities of the compute sleds, or other computing resources of a chassis, that relate to supported computing solutions. The solution monitors may also collect parameters used to configure these hardware and software capabilities of a chassis for operation in support of a computing solution. The identified hardware and software capabilities, along with configuration information for the capabilities, may be transmitted by the individual solution monitors to a chassis management controller.

As described with regard to FIG. 1, a chassis management controller may maintain a computing solution repository used to store the collected settings and parameters for use in configuring replaceable hardware components of a chassis in continuing support of computing solutions. By maintaining collected computing solution configurations by the chassis management controller, configuration information may be preserved and used to reestablish computing solution configurations upon replacement or reinitialization of chassis hardware components. Without use of a chassis management controller in this manner, computing solution configurations are not be preserved through tracking the configurations of the individual chassis hardware components due to lack of visibility of certain aspects of computing solutions.

For instance, a chassis may utilize multiple network adapters, such as network controllers 140 of FIG. 1, in support of certain computing solutions. In certain computing solution configurations, multiple network controllers may be logically combined to present a single virtual network interface that provides the combined bandwidth of the individual network controllers. Such computing solutions may require configuration of the individual network controllers to present a single virtual network interface, as well as configurations used by other components of the chassis to utilize this virtual network interface, such as configurations of compute sleds, storage sleds and/or the chassis management controller. Upon replacement of one of the combined network controllers with an upgraded network controller, reconfiguration of the combined virtual network interface may require reconfiguration of all combined network controllers, as well as reconfiguration of the network interfaces utilized by the other components of the chassis. At 310, all such configurations related to a computing solution are collected and reported by the individual solution monitors. At 325, the chassis management controller stores the reported configuration information to the computing solution repository.

In addition to receiving configuration information from solution monitors instantiated by replaceable components, at block 315, the chassis management controller may also directly detect certain configuration settings related to computing solutions. For instance, a chassis management controller may interface with a replaceable power supply, such as a power supply sled described with regard to FIG. 1, that may be configured to support specific computing solutions. For example, a replaceable power supply may support a high-performance graphics computing solution by providing certain compatible compute sleds with temporary increases in available power in order to support peak processing demands. In such embodiments, the chassis management controller may interface directly with a replaceable power supply in collecting and monitoring configuration information related to such computing solutions.

As illustrated, at 320, the chassis management controller may periodically receive updated computing solution information. As described, in some embodiments, supported computing solutions may be defined by blueprints that specify attributes of a specific computing solution, where the attributes identify preferred and alternate replaceable hardware components of a computing solution as well as configuration information for these components. Computing solution blueprints may be created by administrators tasked with supporting computing solutions, the chassis used by computing solutions and/or certain of the chassis hardware components. Upon creating or updating a computing solution, a blueprint may be pushed to all chassis that are administered as described herein. The chassis management controller of each participating chassis may receive and store the computing solution blueprints to a solution repository for use in configuring replaceable hardware components of a chassis in support of a specific computing solution.

Based on reports received from solution monitors and/or based on its own solution monitoring, at block 330, the chassis management controller detects any changes to replaceable hardware components of the chassis. For instance, a chassis management controller may detect the replacement of a storage sled or coupling of a new storage sled within one of the bays of the chassis. The chassis management controller may similarly detect replacement or addition of a compute sled within one of the chassis bays. As described, network controllers, power supplies, I/O controllers and various other replaceable components may be removed from the chassis and replaced with alternate components that may be upgraded components, exact replacements or, in some cases, downgraded components. In other instances, the solution monitors of replaceable hardware components, such as the solution monitors 165*a-n* of compute sleds 105*a-n* of FIG. 1, may report such changes. For instance, a solution monitor of a compute sled may report operating system changes that enable or disable capabilities of the compute sled, such as configuration changes that enable access to a storage sled.

At block 335, the chassis management controller determines the identity of the new or modified replaceable hardware components that have been coupled to the chassis. In certain embodiments, the identity of replaceable hardware components may be determined by the chassis management controller through direct queries supported by the replaceable hardware components. In some embodiments, replaceable hardware components may be configured to report identity information to the chassis management controller upon being coupled to the chassis.

Based on the identity of new hardware components coupled to the chassis, at block 340, the chassis management controller utilizes the solution repository to identify settings for configuring the new hardware in support of a computing solution that is currently being supported by chassis. For instance, upon replacement of a compute sled coupled to the chassis, the new compute sled may be identified and, based on a solution blueprint stored in the solution repository, is determined to be compatible with the computing solution currently supported by a chassis. In a scenario where the current computing solution provides support for artificial intelligence processing, a compute sled including an artificial intelligence processor may be identified in the blueprint as a preferred compute sled for this computing solution. In other instances, a compute sled may be identified in the blueprint as an alternate compute sled that includes a high-speed processor that is suitable for artificial intelligence computing solutions. Based on the identity of the replaceable hardware identified in the solution blueprint, settings are identified in the hardware registry for configuring the replaceable hardware component.

At block 345, the chassis management controller may identify software settings for configuring the new hardware component in support of the computing solution in the selected solution blueprint. In a scenario where the computing solution provides support for a particular enterprise application, the software settings may be used to configure a new storage sled for operation of the enterprise application. For instance, the software settings may configure a compute sled with permissions for accessing certain data sources or other resources. The software settings may also identify libraries required for operating the enterprise application.

Once the hardware and software settings for configuring a replaceable hardware component have been identified, at block 350, the chassis management controller may generate one or more scripts that may be used for configuring the replaceable hardware for use in support of the computing solution. As illustrated in FIG. 1, the chassis management controller may include an action repository that may be used to generate scripts that apply the hardware settings obtained from the hardware registry and the software settings obtained from the solution registry maintained by the chassis management controller.

It should be understood that various operations described herein may be implemented in software executed by logic or processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A method for automated configuration of replaceable hardware components of a chassis comprising a plurality of IHSs (Information Handling Systems) configured to support a first computing solution, the method comprising:
   initializing, by each of the plurality of IHSs, a process of an operating system of each respective IHS for monitoring settings selected for use by hardware components of the respective IHS in order to adapt the operations of the respective hardware components for a first computing task;
   reporting, by the process of the operating system of each respective IHS, changes to the hardware component settings for hardware components of the respective IHS that adapt the operations of the respective hardware components for the first computing task, wherein the changes to the hardware component settings are reported to a chassis management controller that is installed in the chassis and that manages resources of the chassis that are shared by the plurality of IHSs;
   detecting a coupling of a replaceable hardware component to the chassis;
   selecting, by the chassis management controller, hardware component settings for adapting the operations of the replaceable hardware component that has been detected as coupled to the chassis for the first computing task; and
   configuring the replaceable hardware component that has been detected as coupled to the chassis using the parameters selected by the chassis management controller for adapting the operation of the replaceable hardware component for the first computing task.

2. The method of claim 1, wherein the first computing task comprises an artificial intelligence computation and wherein the hardware component settings selected by the chassis management controller configure an artificial intelligence processor of the replaceable hardware component that has been detected as coupled to the chassis.

3. The method of claim 1, wherein the replaceable hardware component detected as coupled to the chassis comprises a computing sled coupled to a bay of the chassis, and wherein the hardware component settings selected by the chassis management controller configure the compute sled for the first computing task.

4. The method of claim 1,
   wherein the chassis management controller generates a script for configuring the replaceable hardware component that has been detected as coupled to the chassis for the first computing task.

5. The method of claim 1, wherein the replaceable hardware component detected as coupled to the chassis comprises a network controller, and wherein the hardware component settings selected by the chassis management controller configure the network controller as part of a virtual network interface another network controller installed in the chassis.

6. The method of claim 1, wherein the replaceable hardware component detected as coupled to the chassis comprises a storage sled coupled to a bay of the chassis, and wherein the hardware component settings selected by the chassis management controller configure the storage sled with access to a specific data source used in the first computing task.

7. The method of claim 1, wherein the changes to the hardware component settings reported by the by the processes of the operating system of each respective IHS are tracked by the chassis management controller within a settings repository that maps settings used by hardware components of the chassis in order to support the first computing task.

8. The method of claim 7, further comprising:
selecting, upon reconfiguration of the chassis for a second computing task, parameters for adapting operations of the replaceable hardware component detected as coupled to the chassis for the second computing task, wherein the parameters are selected from the settings repository maintained by the chassis management controller.

9. The method of claim 8,
wherein the parameters are selected by the chassis management controller, based on a solution blueprint maintained in the settings repository, wherein the solution blueprint specifies hardware component settings that support the respective computing tasks.

10. The method of claim 1, wherein the process of the operating system of each respective IHS monitors settings selected for use by hardware components based on settings collected by a remote access controller of each respective IHS.

11. A chassis management controller configured as a component of a chassis comprising a plurality of IHSs (Information Handling Systems) configured to support a first computing solution, wherein the chassis management controller that is installed in the chassis and that manages resources of the chassis that are shared by the plurality of IHSs, the chassis management controller comprising:
one or more processors; and
a memory device coupled to the one or more processors, the memory device storing computer-readable instructions that, upon execution by the one or more processors, cause the chassis management controller to:
receive settings reported as in use by hardware components of each of the plurality of IHSs in order to adapt the operations of the respective hardware components for a first computing task, wherein the settings are reported by an operating system process of each of the respective IHS;
track changes to the hardware component settings that adapt the operations of the respective hardware components for the first computing task;
detect a coupling of a replaceable hardware component to the chassis;
select, based on the tracked changes to the hardware component settings, parameters for adapting the operations of the replaceable hardware component that has been detected as coupled to the chassis for the first computing task; and
generate instructions for configuring the replaceable hardware component that has been detected as coupled to the chassis using the selected parameters for adapting the operation of the replaceable hardware component for the computing task.

12. The chassis management controller of claim 11, wherein the specific computing task comprises an artificial intelligence computation, and wherein the hardware component settings selected by the chassis management controller configure an artificial intelligence processor of the replaceable hardware component that has been detected as coupled to the chassis.

13. The chassis management controller of claim 11, wherein the replaceable hardware component detected as coupled to the chassis comprises a storage device coupled to a first of the plurality of IHSs, and wherein the hardware component settings selected by the chassis management controller configure the storage device for support of the first computing task.

14. The chassis management controller of claim 11, wherein the changes to the hardware component settings are tracked based on a settings repository maintained by the chassis management controller.

15. The chassis management controller of claim 14, wherein execution of the instructions further causes the chassis management controller to: determine the replaceable hardware component supports the first computing task based on a solution blueprint of the setting repository that specifies hardware component settings that are used to support the first computing task.

16. A memory device coupled to one or more processors, the memory device storing computer-readable instructions that, upon execution by the one or more processors, cause the processors to:
receive settings reported as in use by hardware components of each of a plurality of IHSs installed in a chassis in order to adapt the operations of the respective hardware components for a first computing task, wherein the settings are reported by an operating system process of each of the respective IHS;
track changes to the hardware component settings that adapt the operations of the respective hardware components for the first computing task;
detect a coupling of a replaceable hardware component to the chassis;
select, based on the tracked changes to the hardware component settings, parameters for adapting the operations of the replaceable hardware component, wherein the settings are reported by an operating system process of each of the respective IHS for the first computing task; and
generate instructions for configuring the replaceable hardware component that has been detected as coupled to the chassis using the selected parameters for adapting the operation of the replaceable hardware component for the first computing task.

17. The memory device of claim 16, wherein the specific computing task comprises an artificial intelligence computation, and wherein the hardware component settings selected by the chassis management controller configure an artificial intelligence processor of the replaceable hardware component that has been detected as coupled to the chassis.

18. The memory device of claim 16, wherein the replaceable hardware component detected as coupled to the chassis comprises a storage device coupled to a first of the plurality of IHSs, and wherein the hardware component settings selected by the chassis management controller configure the storage device for support of the first computing task.

19. The memory device of claim 16, wherein the wherein the instructions are generated by the chassis management controller by generating a script for configuring the replaceable hardware component that has been detected as coupled to the chassis for the first computing task.

20. The memory device of claim 19, wherein the chassis management controller maintains a repository of scripts used in configuring replaceable hardware that is coupled to the chassis.

* * * * *